United States Patent [19]

Yoder

[11] Patent Number: 5,363,798
[45] Date of Patent: Nov. 15, 1994

[54] LARGE AREA SEMICONDUCTOR WAFERS

[75] Inventor: Max N. Yoder, Falls Church, Va.

[73] Assignee: The United States of America as represented by the Secretary of the Navy, Washington, D.C.

[21] Appl. No.: 128,502

[22] Filed: Sep. 29, 1993

[51] Int. Cl.$^5$ .............................. H01L 21/20
[52] U.S. Cl. ..................... 117/89; 117/915; 117/951; 437/126; 437/925; 437/975; 148/DIG. 135
[58] Field of Search .......... 117/89, 915, 951; 437/126, 925, 975; 148/DIG. 135

[56] References Cited

U.S. PATENT DOCUMENTS

| | | | |
|---|---|---|---|
| H28 | 2/1986 | Addamiano | 117/951 |
| 3,627,590 | 12/1971 | Mammel et al. | 437/925 |
| 3,993,533 | 11/1976 | Milnes et al. | |
| 4,116,751 | 9/1978 | Zaromb | |
| 4,512,825 | 4/1985 | Addamiano et al. | 117/915 |
| 4,582,561 | 4/1986 | Ioku et al. | 117/915 |

OTHER PUBLICATIONS

Low-Defect-Density Germanium on Silicon Obtained by a Novel Growth Phenomenon, Appl. Phys. Lett. 60 (7), 17 Feb. 1992; D. P. Malta, et al.
Melting in Semiconductor Nanocrystals, Science, vol. 256, 5 Jun. 1992; A. N. Goldstein, et al.
Extended Pseudomorphic Limits Using Compliant Substrates; Mat. Res. Soc. Symp. Proc, vol. 281; Y. H. Lo, et al. (1993).

Primary Examiner—R. Bruce Breneman
Assistant Examiner—Linda J. Fleck
Attorney, Agent, or Firm—Thomas E. McDonald; William F. McCarthy

[57] ABSTRACT

A method of synthesizing a large area, single crystalline, semiconductor wafer in which the semiconductor is grown on a substrate having a lower melting temperature and higher specific gravity than the overlying semiconductor. The substrate is disposed within an open container or holder having a drain plug. First, a very thin layer of semiconductor is grown on the substrate. Then, the temperature is raised to melt the substrate and anneal the very thin layer of semiconductor. Next, growth of the semiconductor film now floating on the molten substrate is resumed until the desired thickness is obtained. Then, the molten substrate is drained from the holder, the temperature lowered to room temperature, and the nascent large area semiconductor wafer removed from the holder. In an alternate procedure, the molten substrate is not drained from the holder, but the semiconductor is grown to a thickness sufficient to force misfit defects in the underlying substrate as the temperature is lowered and the substrate resolidifies.

9 Claims, 1 Drawing Sheet

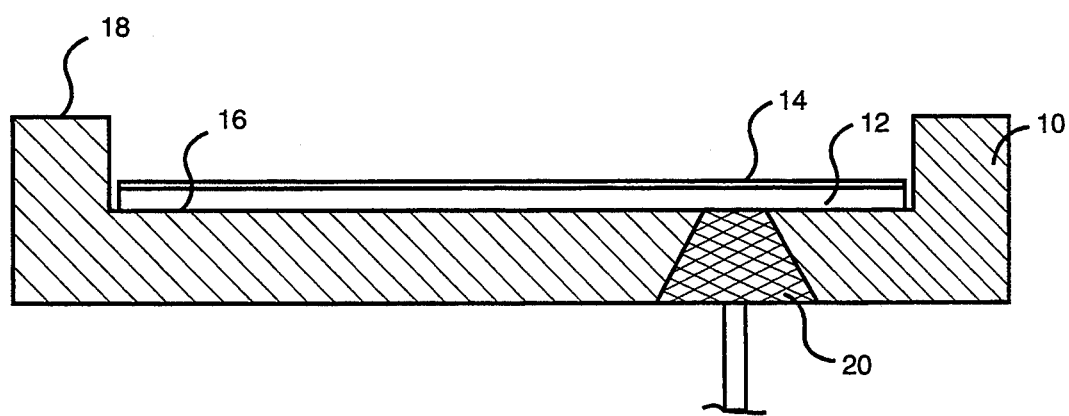

LARGE AREA SEMICONDUCTOR WAFERS

BACKGROUND OF THE INVENTION

1. Technical Field

The invention relates generally to semiconductor manufacture, and, in particular, to a method of fabricating large area, single crystalline semiconductor wafers.

2. Background Art

The production yield on integrated circuits is primarily dependent on defect density and on wafer size. Of the major semiconductor materials in use today, only silicon is available in large area (e.g., 8" diameter) low defect density boules. Gallium Arsenide is readily available in 3" diameter boules exhibiting a defect density exceeding $10^4/cm^2$. Indium Phosphide (InP) is available in 2" diameter boules, but defect density exceeds $10^5/cm^2$. Germanium (Ge) is available in defect-free boules of 2" diameter. Hexagonal (6H) Silicon Carbide (SIC) is commercially available in 1.25" diameter boules with an average defect density of $10^5/cm^2$, but this defect density is not uniform; large regions are virtually defect free while other regions have excessive defects. Virtually all other single crystalline semiconductors must be grown on foreign substrates. This is known as heteroepitaxy and almost always creates unwanted defects.

Silicon carbide (SIC) is known in nearly 200 different polytypes. Only hexagonal (6H) silicon carbide is commercially available in 1.25" diameter boules with an average defect density of $10^5/cm^2$, but this defect density is not uniform; large regions are virtually defect free while other regions have excessive defects. Cubic (3C) SiC films are available on silicon substrates, but the defect density exceeds $10^8/cm^2$, rendering them unsuitable for integrated circuit (IC) manufacture. There is little prospect of commercially available 6H SiC wafers exceeding 2" diameter in the near future. Since virtually all automatic wafer handling equipment requires 3" diameter and larger wafers, the prospects of using current SiC technology for large scale IC manufacture in the near future are poor.

Semiconducting diamond, although a superb material, has not been successfully grown on substrates other than natural diamond. Natural diamond substrates exceeding 1 cm diameter are rare and very expensive thus precluding widespread use of semiconducting diamond technology.

A new class of III-V compound semiconductor materials characterized by anions of nitrogen, e.g., GeN, AlN, BN, $BCN_2$, exhibit electronic properties of great interest to the semiconductor community, but the only useful substrates for their heteroepitaxial growth are those of sapphire and SiC. In each case problems exist with respect to lattice mismatch.

Virtually all of the higher bandgap semiconductors of interest (except 6H SiC) have no substrates of like kind available for growth. The foreign substrates that are available generally have free surface energies much lower than those of the material-to-be-synthesized. As a result, the material-to-be-synthesized tends to form islands rather than deposit as a smooth two-dimensional film.

Recently it has been shown that very small (i.e., <50 atomic lattice-constants in any direction) particles of a semiconductor exhibit properties different from that of their bulk counterparts. For example, the variation of melting temperature with size of CdS nanocrystals is described in a report by A. N. Goldstein, C. M. Echer, and A. P. Alivisatos, "Melting in Semiconductor Nanocrystals", SCIENCE, Vol. 256, Jun. 5, 1992, pages 425–427. Typical variations include increased bandgap, significantly reduced melting temperature, and up to a 50% reduction in dielectric constant.

As reported in a paper by D. P. Malta, J. B. Posthill, R. J. Markunas, and T. P. Humphreys entitled "Low-defect-density germanium on silicon obtained by a novel growth phenomenon", Appl. Phys. Lett. 60 (7), Feb. 17, 1992, pages 844–846, researchers at the Research Triangle Institute (R.T.I.) have demonstrated that very thin layers of germanium (e.g. <50 nanometer thick) epitaxially deposited on silicon at 900° C. are characterized by an interfacial melting phenomenon that appears to relieve the misfit dislocations otherwise developed by their heteroepitaxial relationship to the underlying silicon, which exhibits a lattice constant 4% smaller than the lattice constant of germanium. Unfortunately, applications of this approach appear to be limited to situations wherein the material-to-be-synthesized melts at temperatures lower than does the substrate.

As described in a paper by Y. H. Lo, W. J. Schaff, and D. Teng, entitled "EXTENDED PSEUDOMORPHIC LIMITS USING COMPLIANT SUBSTRATES" Mat. Res. Soc. Symp. Proc., Vol. 281, pages 191–196, Prof. Lo and his associates at Cornell University have demonstrated that normally lattice-mismatched semiconducting films can be grown on extremely thin substrates in such a manner that the strain is relieved in the underlying substrate rather than in the thicker heteroepitaxially grown overlayer as is the usual case for growth on substrates of normal thickness. A major problem with this approach, however, is that extremely thin substrates are not and can not be made self-supporting in large areas required for semiconductor manufacture. Nevertheless, the experiments do demonstrate that overlying layers need not necessarily exhibit misfit dislocations generated by lattice-mismatched substrates.

SUMMARY OF THE INVENTION

It is a primary object of the invention to provide a method of synthesizing large area wafers of semiconductors that have nc, suitable lattice-matched substrates.

It is another object of the invention to provide a method of synthesizing large area single crystal semiconductor wafers on non-lattice-matched foreign substrates.

It is a further object of the invention to provide a method of synthesizing large area wafers of semiconductor material on foreign substrates having free surface energies much lower that those of the semiconductor material to be synthesized.

In the method of synthesizing a large area semiconductor wafer, according to the invention, the semiconductor is grown on a substrate having a lower melting temperature and higher specific gravity than the overlying semiconductor. The substrate is disposed within an open container or holder having a drain plug for draining liquid or molten substances. The holder has a higher melting temperature than the substrate or the expected growth temperature of the semiconductor. First, a very thin layer of semiconductor is grown on the substrate at a minimal temperature. Then, in contrast to the approach of Malta et al, the temperature is raised to melt the substrate and anneal the very thin layer of semiconductor. Next, the temperature is adjusted to the optimum temperature above the melting temperature of the substrate for growing the semiconductor film now floating on the molten substrate, and growth of the semiconductor is resumed until the desired thickness is obtained. Then, the molten substrate is drained from the holder, the temperature lowered to room temperature, and the nascent large area semiconductor wafer removed from the holder.

In an alternate procedure, the molten substrate is not drained from the holder, but the semiconductor is grown to a thickness sufficient to force misfit defects in the underlying substrate as the temperature is lowered and the substrate solidifies. This procedure, in a manner not too dissimilar from that of Lo et al, forces the misfit dislocations into the substrate. In contrast to Lo et al, there is no limit to substrate area. This approach of resolidifying the substrate is most useful when the diffusivity of substrate material into the growing overlayer is sufficiently high to otherwise cause unwanted impurity incorporation.

The semiconductor may be grown on the molten or solid substrate by any of the known methods of epitaxial deposition.

The invention will be better understood, and further objects and advantages will become more apparent from the following detailed general description and description of a specific embodiment.

BRIEF DESCRIPTION OF THE DRAWING

The sole FIGURE is a cross-sectional side view of a carbon or silicon carbide coated carbon susceptor for holding and heating a substrate, which may be used with known apparatus for epitaxially growing a semiconductor on a substrate, to grow large area semiconductor wafers by the methods set forth herein.

DETAILED DESCRIPTION OF PREFERRED EMBODIMENTS

The methods of synthesizing large area wafers of semiconductor material described herein combine and substantially modify the thin film germanium anneal techniques of Malta et al and the compliant substrate technique of Prof. Lo with pseudomorphic films in a procedure that circumvents the area limitations encountered by Lo and the requirement of Malta et al for a substrate that melts at a higher temperature than the layer to be grown.

A substrate is chosen that exhibits: (1) a lower melting temperature than does the material to be synthesized; (2) a higher specific gravity than does the material to be synthesized; (3) immunity to etching under the conditions typical for growth of the overlying material to be synthesized; and (4) low diffusivity in the material to be synthesized. In the first procedure described herein, in which the molten substrate is removed, the diffusivity of the substrate in the material to be synthesized should be less than $\epsilon^{-0.14/kT}$, where $\epsilon$ is the base of the natural logrithm, T is the absolute temperature, and k is the Boltzmann's constant. In the alternate procedure in which the substrate is resolidified rather than removed, this diffusivity requirement may be relaxed by two orders of magnitude. In choosing among possible substrates which meet the above requirements, the preferred choice is obviously the substrate having a lattice constant nearest that of the overlying material to be synthesized.

The substrate is placed in a holder that: (1) melts at a temperature higher than does the substrate and also higher than the expected growth temperature; (2) has a recessed region of dimensions greater than the substrate and at least as deep as 3 times the thickness of the substrate; (3) is positioned horizontally with the recess upward facing; (4) is fitted with a heater or configured as a susceptor such that its temperature can be raised above the temperature necessary to melt the substrate and as high as is necessary to grow the overlying semiconductor of interest; and (5) is fitted with a drain plug to affect the draining of any molten substance.

The substrate is placed in the holder and brought up to the temperature sufficient to nucleate and grow the overlying material of interest. The material is grown to a thickness of three times that of its pseudomorphic limit (i.e., to the point where misfit dislocation defects are assured). This thickness will vary as a function of the differential of lattice constants of substrate and overlying material and as a function of the relative binding energies between host atoms of each of the materials. At this thickness, the upper atomic layers of the overlying material begin to take on a structure characterized by its own natural lattice constant (e.g., the Ge on Si demonstration by Malta et The substrate temperature is next raised to a temperature exceeding its melting temperature, but below the boiling temperature of the substrate material, below the melting temperature of the substrate holder, and below the melting temperature of the overlying material to be synthesized. In this manner, the temperature of the now very thin overlayer film approaches the ideal growth temperature of 67% of its melting temperature, since its effective melting temperature is considerably reduced because of its very thin dimension. Because of the relative specific gravities of the substrate and the synthesized overlayer, the thin solid overlayer now floats on the now molten substrate. The temperature is adjusted to the optimum within the above stated range so as to anneal out the defects in the floating crystalline overlying film. As the underlying substrate melts, the overlying material is stress relieved, and the overlying material, by virtue of its very thin dimensional nature, readily anneals such that its defect density approaches zero. The growth temperature is next adjusted to a point within the above-stated range to best grow the material of interest (ideally about 67% of its bulk melting temperature). The growth of the overlying material of interest continues until the desired thickness is reached. At this point, the former, but now liquid, substrate is drained from its holder, and the temperature is lowered to room temperature after which the nascent overlayer wafer is retrieved.

The semiconductor material may be grown on the substrate by any of the known epitaxy methods, such as chemical vapor deposition (CVD), metal organic vapor phase epitaxy (MOVPE), metal organic chemical vapor deposition (MOCVD), molecular beam epitaxy (MBE), atomic layer epitaxy (ALE), or plasma-assisted variations of any of these known epitaxy methods.

The procedure described is somewhat similar to the present industrial method of fabricating window glass on a molten bed of lead, excepting, of course, that the molten window glass is also first melted and therefore exhibits no effective "seed" from which to grow a single crystal.

The above-described procedure also alleviates the problems normally associated with free surface energy wherein materials of high free surface energy deposited on materials of low free surface energy tend to pool or coalesce as islands. Just as an oil drop on an ice cube spreads into a uniform film on the water when the ice cube melts, so does the tendency of islanding "anneal" into a two dimensional film when the substrate melts.

Large Area SiC Wafers

Silicon carbide, when deposited at comparatively low temperatures (e.g., <1500 Celsius) and in the absence of electropositive impurities tends to nucleate in a 3C cubic configuration. Once nucleated as a 3C polytype, it remains in its cubic configuration until exposed to a temperature greater than 1800 Celsius.

Silicon melts at 1423 Celsius. The specific gravity of silicon is greater than that of any polytype of SiC. SiC of any type will literally float on molten silicon.

Techniques for nucleating 3C SiC on single crystal silicon substrates have been known for nearly two decades. In general, they involve an in situ cleaning of the silicon surface followed by an exposure to a carbonaceous gas (e.g., ethylene) at temperatures approaching 1400 Celsius. This generates a thin 3C SiC overlayer. The traditional growth procedure then proceeds to introduce silane or another silicon-containing gas in addition to the carbonaceous gas and in this manner thick layers of (defect-ridden) 3C SiC are grown. The procedure described below overcomes defect problems experienced by this approach and results in a reduction in the defect density of 3C SiC.

The silicon carbide coated, carbon susceptor 10 shown in the sole FIGURE is similar to known susceptors used in the reaction chamber of semiconductor deposition apparatus in that it is heated by an electrical induction coil (not shown) and is used to hold and heat a substrate 12 during deposition of a semiconductor layer 14. The susceptor 10 has two features not generally found in known susceptors, namely, a flat, recessed region 16 in the susceptor top side 18 having a depth at least three times the thickness of the substrate 12 disposed therein, and a drain valve 20 which can be opened by a conventional mechanical linkage (not shown) to drain liquid or molten material from the recessed region 16.

The silicon substrate 12 is placed in the recessed region 16 of the carbon susceptor 10. The 3C SiC layer 22 is grown in any of the traditional manners, using nitrogen impurities, but growth is stopped when the layer is between 40 and 50 nanometers thick. Ammonia is introduced to provide nitrogen so as to maintain the 3C polytype configuration. At this point, the temperature is raised to 1675 Celsius to melt the underlying silicon and anneal the thin 3C SiC film. As the silicon melts, the strain in the overlying and now floating, but solid, 3C SiC film is relieved and its defects are annealed out. After 15 minutes, the ammonia is secured, siliconaceous and carbonaceous growth gases are reintroduced (but without ammonia unless n-type material is wanted), and the 3C SiC growth continues at the higher temperature. The ratio of carbonaceous to siliconaceous feed stock gases must be increased so as to compensate for the increased silicon vapor pressure created by the molten silicon. Since no boron or other electropositive impurities are present in the annealled film to initiate transformation into alpha material, the SiC crystal continues to grow as a 3C polytype. After one micrometer of growth, this annealling procedure may be safely terminated by reducing the temperature to 1400 Celsius to initiate silicon recrystallization. Since the overlying 3C SiC layer is so much stronger than the silicon recrystallizing under it, lattice mismatch defects will be taken up in the resolidifying silicon rather than in the overlying SiC. The overlying SiC film must be grown to a thickness of at least one micrometer to insure that it is strong enough to force misfit defects into the underlying and softer recrystallizing silicon. Alternatively, the overlying SiC crystal can be grown thicker than one micrometer. This growth can continue at either the higher (molten substrate) or lower (solid substrate) growth temperature, but the lower temperature has certain advantages regarding purity. Alternatively, the molten silicon may be drained before the cool down is effected.

While the above procedure is efficacious in rendering 3C silicon carbide crystals as large as available silicon substrates (e.g., 8" diameter), it does not directly address hexagonal SiC film growth. These hexagonal SiC films can be rendered by raising the temperature of the molten silicon to 1850 Celsius rather than 1675 Celsius and by adding an electropositive impurity (e.g., boron, aluminum, magnesium, or beryllium) and no ammonia to the initial 3C SiC thin film. The anneal step is also without ammonia. At the 1850 Celsius temperature, the overlying defect-ridden 3C SiC thin film is then transformed into a stress-free hexagonal SiC thin film. Its continued growth can proceed at 1850 Celsius without the addition of the electropositive impurity or even with the addition of ammonia.

Since there are many variations, modifications, and additions to the specific embodiments of the invention described herein which would be obvious to one skilled in the art, it is intended that the scope of the invention be limited only by the appended claims.

What is claimed and desired to be secured by Letters Patent of the United States is:

1. A method of synthesizing a large area wafer of single crystalline semiconductor material, which comprises the steps of:
    (a) selecting a foreign substrate for said semiconductor material, said substrate having
        (1) a lower melting temperature than does the semiconductor material to be synthesized,
        (2) a higher specific gravity than does the semiconductor material to be synthesized,
        (3) immunity to etching under the conditions typical for growth of the semiconducting material to be synthesized, and
        (4) low diffusivity in the semiconductor material to be synthesized;
    (b) disposing said substrate in a substrate holder which
        (1) melts at a temperature higher than does the substrate and also higher than the expected growth temperature of the semiconductor material,
        (2) has a recessed region having bottom planar dimensions greater than the substrate and a depth greater than the combined thickness of the substrate and the thickest film of semiconductor material to be synthesized, and
        (3) is positioned horizontally with the recess upward facing;
    (c) growing an epitaxial layer of the semiconductor material onto the substrate to a thickness of nominally three times that of the pseudomorphic limit of the semiconductor material;

(d) raising the temperature of the substrate to a first selected temperature within a temperature range exceeding the melting temperature of the substrate, but below the boiling temperature of the substrate, the melting temperature of the substrate holder, and the melting temperature of the semiconductor material, for a sufficient time to melt the substrate and anneal the synthesized solid nascent layer of the semiconductor material floating on the molten substrate;

(e) maintaining the molten substrate at a second selected temperature within said temperature range while resuming the growth of said epitaxial layer of the semiconductor material floating on the molten substrate until the desired thickness of semiconductor material is reached; and (f) reducing the temperature of the substrate holder and material disposed therein to room temperature and removing the wafer comprising said semiconductor material from the substrate holder.

2. A method of synthesizing a large area wafer of semiconductor material, as described in claim 1, wherein in step (e), said second selected temperature is the temperature within said temperature range to best grow the semiconductor material.

3. A method of synthesizing a large area wafer of semiconductor material, as described in claim 1, wherein the depth of the recessed region of the substrate holder is at least three times the substrate thickness.

4. A method of synthesizing a large area wafer of semiconductor material, as described in claim 1, wherein in step (e), the desired thickness of semiconductor to be reached is at least one micrometer, and said method further comprises, between step (e) and step (f), the steps of:

lowering the temperature of the substrate to a third temperature below its melting temperature to cause the substrate to solidify; and maintaining the substrate at said third temperature while resuming the growth of the layer of semiconductor material until the final desired thickness is reached.

5. A method of synthesizing a large area wafer of semiconductor material, as described in claim 1, wherein the substrate holder comprises drain means for draining any molten substance from the holder cavity, and said method further comprises, between step (e) and step (f), the step of draining the molten substrate from the holder cavity.

6. A method of synthesizing a large area wafer of semiconductor material, as described in claim 1, wherein said semiconductor material is silicon carbide and said substrate is silicon.

7. A method of synthesizing a large area wafer of semiconductor material, as described in claim 4, wherein said substrate holder is carbon.

8. A method of synthesizing a large area wafer of semiconductor material, as described in claim 5, wherein said carbon substrate holder is coated with silicon carbide.

9. A method of synthesizing a large area, single crystalline, silicon carbide wafer, which comprises the steps of:

(a) disposing a silicon substrate in a substrate holder which
  (1) melts at a temperature higher than 1850 Celsius,
  (2) has a recessed region having bottom planar dimensions greater than the substrate and a depth greater than three times the thickness of the substrate, and
  (3) is positioned horizontally with the recess upward facing within the reaction chamber of a known semiconductor deposition apparatus;

(b) growing an n-type epitaxial 3C SiC layer onto the substrate to a thickness between 40 and 50 nanometers;

(c) introducing ammonia into the chamber to provide nitrogen as as to maintain the 3C polytype configuration of the SiC layer;

(d) raising the temperature to 1675 Celsius to melt the silicon substrate and anneal the synthesized solid nascent 3C SiC layer floating on the molten substrate;

(e) securing the ammonia;

(f) maintaining the molten substrate at 1675 Celsius while resuming the growth of said 3C SiC layer floating on the molten substrate until the thickness of the 3C SiC layer reaches at least one micrometer; and (g) reducing the temperature of the substrate holder and material disposed therein to room temperature and removing the wafer comprising silicon carbide from the substrate holder.

* * * * *